United States Patent
Chiang et al.

(10) Patent No.: US 11,276,806 B2
(45) Date of Patent: Mar. 15, 2022

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Yi Wen Chiang, Kaohsiung (TW);
Kuang-Hsiung Chen, Kaohsiung (TW);
Lu-Ming Lai, Kaohsiung (TW);
Hsun-Wei Chan, Kaohsiung (TW);
Hsin-Ying Ho, Kaohsiung (TW);
Shih-Chieh Tang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 43 days.

(21) Appl. No.: 16/734,046

(22) Filed: Jan. 3, 2020

(65) Prior Publication Data
US 2021/0210662 A1    Jul. 8, 2021

(51) Int. Cl.
| | |
|---|---|
| *H01L 33/54* | (2010.01) |
| *H01L 31/02* | (2006.01) |
| *H01L 31/0203* | (2014.01) |
| *H01L 31/18* | (2006.01) |
| *H01L 33/58* | (2010.01) |
| *H01L 33/62* | (2010.01) |
| *H01L 31/0232* | (2014.01) |

(52) U.S. Cl.
CPC .......... *H01L 33/54* (2013.01); *H01L 31/0203* (2013.01); *H01L 31/02005* (2013.01); *H01L 31/02327* (2013.01); *H01L 31/18* (2013.01); *H01L 33/58* (2013.01); *H01L 33/62* (2013.01); *H01L 2933/005* (2013.01)

(58) Field of Classification Search
CPC ......... H01L 33/54; H01L 33/58; H01L 33/62; H01L 31/02005; H01L 31/0203; H01L 31/02327; H01L 31/18; H01L 2933/005
USPC .......................................................... 257/98
See application file for complete search history.

(56) References Cited

U.S. PATENT DOCUMENTS

| | | | | |
|---|---|---|---|---|
| 5,037,779 | A | * | 8/1991 | Whalley ................ H01L 21/56 257/687 |
| 5,962,810 | A | * | 10/1999 | Glenn ................ H01L 31/0203 174/524 |
| 7,026,710 | B2 | | 4/2006 | Coyle et al. |
| 2011/0024862 | A1 | * | 2/2011 | Tu .................... H01L 27/14618 257/434 |
| 2011/0096219 | A1 | * | 4/2011 | Lee ........................ H01L 24/97 348/308 |
| 2014/0097451 | A1 | | 4/2014 | Lin |

* cited by examiner

*Primary Examiner* — Igwe U Anya
(74) *Attorney, Agent, or Firm* — Foley & Lardner LLP

(57) ABSTRACT

A semiconductor device package includes a carrier, a die, an encapsulation layer and a thickness controlling component. The die is disposed on the carrier, wherein the die includes a first surface. The encapsulation layer is disposed on the carrier, and encapsulates a portion of the first surface of the die. The encapsulation layer defines a space exposing another portion of the first surface of the die. The thickness controlling component is disposed in the space.

22 Claims, 16 Drawing Sheets

SEMICONDUCTOR DEVICE PACKAGE AND METHOD FOR MANUFACTURING THE SAME

BACKGROUND

1. Technical Field

The present disclosure relates to a semiconductor device package and method for manufacturing the same.

2. Description of the Related Art

Optical device package includes optical die(s) to provide optical application. For example, an optical sensor such as an ambient light sensor (ALS) is utilized to sensor the intensity of ambient light. The ALS is designed to sense the ambient light, and other lights from the oblique directions may interfere with the ALS, and should be blocked from entering the ALS. The comparative optical device package uses an opaque cap to block light from the oblique directions, which increases the overall thickness and process complexity.

SUMMARY

In some embodiments, a semiconductor device package includes a carrier, a die, an encapsulation layer and a thickness controlling component. The die is disposed on the carrier, wherein the die includes a first surface. The encapsulation layer is disposed on the carrier, and encapsulates a portion of the first surface of the die. The encapsulation layer defines a space exposing another portion of the first surface of the die. The thickness controlling component is disposed in the space.

In some embodiments, an optical device package includes a carrier, an optical die, an opaque encapsulation layer and a transparent layer. The optical die is disposed on the carrier, wherein the die includes a first surface. The opaque encapsulation layer is disposed on the carrier, and encapsulates the optical die. The opaque encapsulation layer includes a first upper surface and defines a space exposing a portion of the first surface of the optical die. The transparent layer is filled in the space. The transparent layer includes a second upper surface, and the first upper surface and the second upper surface are located at a substantially same horizontal level.

In some embodiments, a method of manufacturing a semiconductor device package includes the following operations. At least one die is provided. A thickness controlling component covering a portion of an upper surface of the at least one die is formed. An encapsulation layer is formed to cover another portion of the upper surface of the at least one die.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
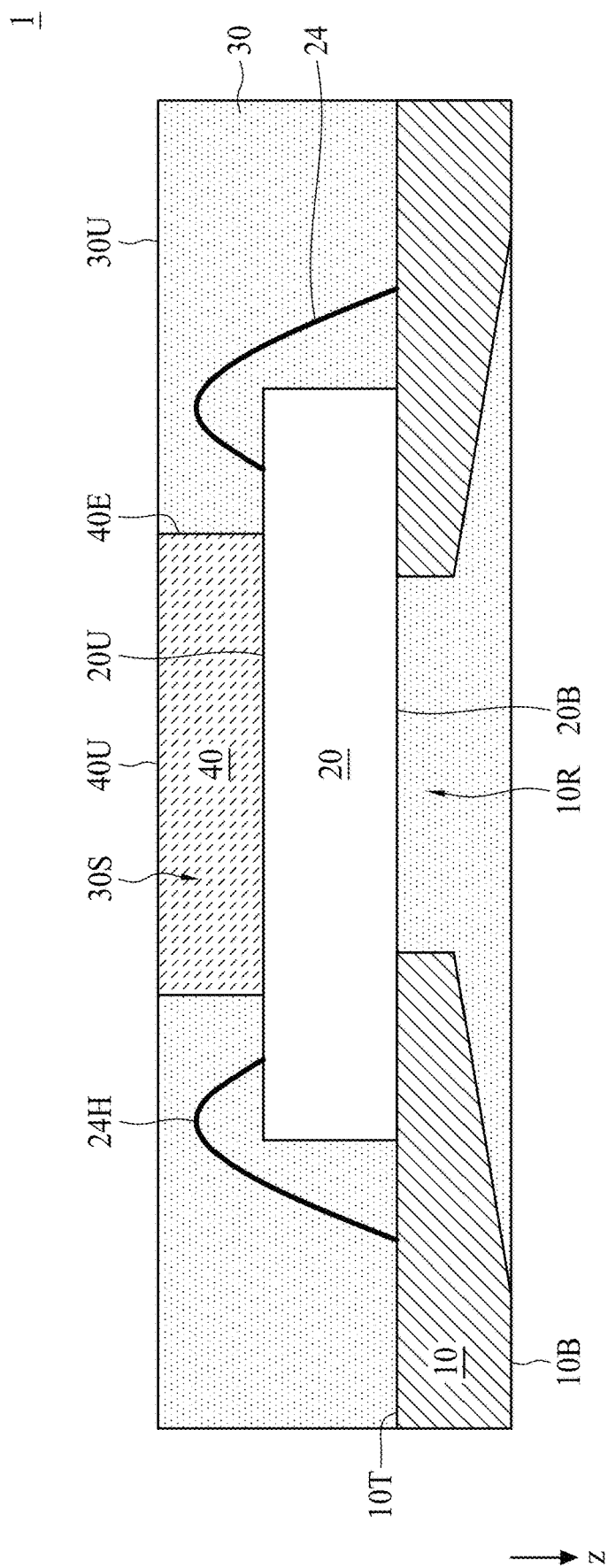
FIG. 1 is a schematic cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "thickness controlling component" may refer to a component whose thickness can be precisely controlled. For example, the thickness tolerance control in the operation for manufacturing the thickness controlling component is less than or equal to ±10%, less than or equal to ±5% or less than or equal to ±1%. In some embodiments, the operation for manufacturing the thickness controlling component may include, but is not limited to, for example photolithography operation, nanoimprinting operation, two-photon polymerization (2PP) operation or the like.

As used herein the term "opaque" may refer to a structure or a layer which does not allow a light within a specific wavelength range such as a visible light or an invisible light passing, and the term "transparent" may refer to a structure or a layer which allows a light within a specific wavelength range such as a visible light or an invisible light passing.

As used herein the term "optically-sensitive material" may refer to a material sensitive to a light within a specific wavelength range in an optical curing operation, and the term "optically-cured material" may refer to the optically-sensitive material after being optically cured by the light. Some property or characteristic of the optically-sensitive material is changed after the optical curing operation, and is different from the optically-cured material.

Present disclosures provide semiconductor device packages including QFN packages, DFN packages, LGA packages or other different types of packages with thickness controlling component. The thickness of the thickness controlling component can be precisely controlled to reduce the overall thickness of the semiconductor device package.

Figure 1A:
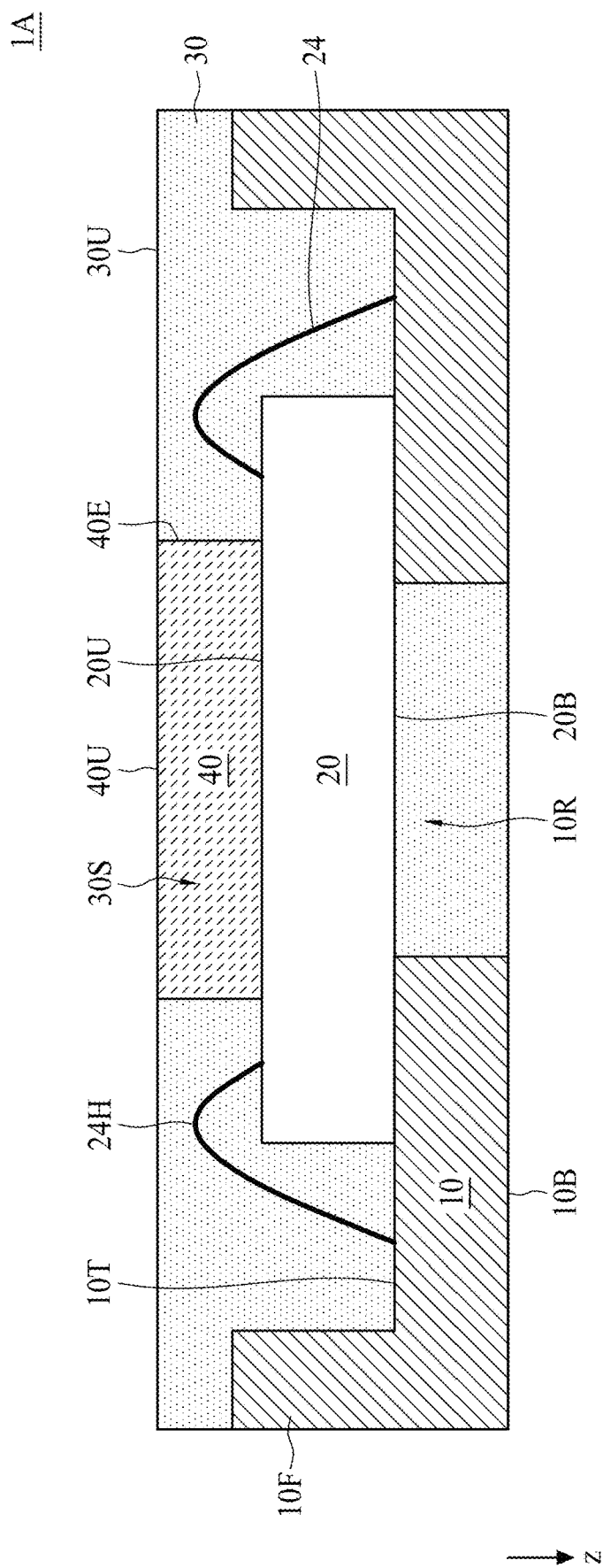
FIG. 1A is a schematic cross-sectional view of a semiconductor device package in accordance with some embodiments of the present disclosure.
Figure 1B:
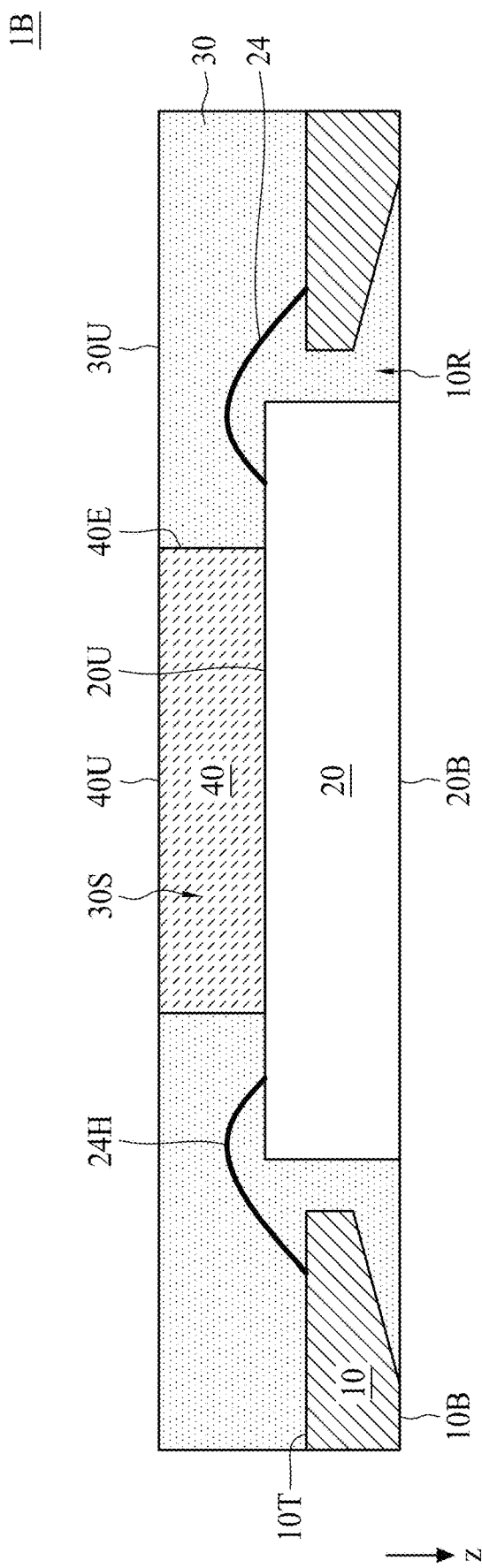
FIG. 1B is a schematic cross-sectional view of a semiconductor device package in accordance with some embodiments of the present disclosure.

FIG. 1 is a schematic cross-sectional view of a semiconductor device package 1 in accordance with some embodiments of the present disclosure. As shown in FIG. 1, FIG. 1A and FIG. 1B, the semiconductor device package 1 includes a carrier 10, a die 20, an encapsulation layer 30 and a thickness controlling component 40. The carrier 10 may be configured to electrically connect the die 20 to an external electronic component such as a printed circuit board (PCB). In some embodiments, the carrier 10 may include a lead frame. In some other embodiments, the carrier 10 may include a substrate such as a circuit substrate, an interposer, another semiconductor die or the like. The lead frame may include a top surface 10T and a bottom surface 10B. In some embodiments, the lead frame may further a recess 10R. In some embodiments, the bottom surface 10B of the lead frame may include a concaved surface.

The die 20 is disposed on the carrier 10. In some embodiments, the die 20 is disposed on the top surface 10T of the carrier 10, for example by an adhesive layer. The die 20 includes a first surface (e.g., an upper surface) 20U, and a second surface (e.g., a bottom surface) 20B opposite to the first surface 20U. In some embodiments, the second surface 20B faces the carrier 10, and may be partially exposed to the recess 10R. In some embodiments, the semiconductor device package 1 may include, but is not limited to, an optical device package. By way of example, the optical device package may include an ambient light sensor (ALS), a proximity sensor or other types of optical package. The die 20 may include an optical die such as an optical sensor die, a light emitting die or a combination thereof.

The encapsulation layer 30 is disposed on the carrier 10, and encapsulates a portion of the first surface 20U of the die 20. In some embodiments, the encapsulation layer 30 may include an opaque encapsulation layer which is not permeable to light. The encapsulation layer 30 may include a molding compound and formed by a molding process, for example. The encapsulation layer 30 defines a space 30S exposing another portion of the first surface 20U of the die 20. For example, the die 20 may include one or more light responsive regions such as sensing regions or light emitting regions, and the space 30S exposes the light responsive regions. The encapsulation layer 30 may also encapsulate edges of the die 20. The encapsulation layer 30 may be further filled in the recess 10R of the carrier 10 and encapsulates a portion of the second surface 20B of the die 20.

The thickness controlling component 40 is disposed in the space 30S. The thickness controlling component 40 is a component whose thickness can be precisely controlled. For example, the thickness tolerance control in the process for manufacturing the thickness controlling component is less than or equal to ±10%, less than or equal to ±5% or less than or equal to ±1%. In some embodiments, the material of the thickness controlling component 40 includes an optically-sensitive material such as photoresist, and the thickness and pattern of the thickness controlling component 40 can be formed by an optical curing operation such as photolithography operation. After the optically curing operation, the material of the thickness controlling component 40 includes an optically-cured material such as a transparent optically-cured material. In some embodiments, the thickness controlling component 40 is in contact with the first surface 20U of the die 20. In some embodiments, the thickness controlling component 40 may include, but is not limited to, a single-layered thickness controlling component.

Furthermore, the thickness of the thickness controlling component 40 can be controlled to be thin, for example in a range of about 100 micrometers to about 150 micrometers or even thinner. In some embodiments, the thickness controlling component 40 is formed on the die 20 prior to formation of the encapsulation layer 30, and thus the thickness controlling component 40 can be used to control the thickness of the encapsulation layer 30. In some embodiments, the thickness controlling component 40 includes a transparent layer, and configured as an optical window for the die 20 such that light can pass the thickness controlling component 40. The thickness controlling component 40 can further be configured as a transparent encapsulation layer to protect the die 20. Accordingly, the semiconductor device package 1 is equipped with both a transparent encapsulation layer and an opaque encapsulation layer, and the overall thickness can still be reduced.

In some embodiments, electrical terminals such as bonding pads are disposed on the first surface 20U of the die 20, and the semiconductor device package 1 may further include a plurality of bonding wires 24 electrically connecting the die 20 to the carrier 10. The bonding wires 24 may be encapsulated by the encapsulation layer 30. In some other embodiments, the electrical terminals may be disposed on the second surface 20B, and the die 20 may be electrically connected to the carrier 10 by flip-chip bonding or the like.

The encapsulation layer 30 includes a first upper surface 30U, and the thickness controlling component 40 includes a second upper surface 40U. In some embodiments, the first upper surface 30U and the second upper surface 40U are located at a substantially same horizontal level. In some embodiments, the first upper surface 30U of the encapsulation layer 30 includes a substantially flat surface. In some embodiments, the second upper surface 40U of the thickness controlling component 40 includes a substantially flat surface. The first upper surface 30U and the second upper surface 40 may be substantially coplanar. In some embodiments, an edge 40E of the thickness controlling component 40 is substantially perpendicular to the second upper surface 40U of the thickness controlling component 40. The edge 40E of the thickness controlling component 40 may be in contact with the encapsulation layer 30. In some embodiments, the thickness controlling component 40 and the encapsulation layer 30 do not overlap in a vertical projection direction Z.

In some embodiments, each of the bonding wires 24 may include a wire loop with a highest point 24H, and the highest point 24H of each of the bonding wires 24 is lower than the second upper surface 40U of the thickness controlling component 40.

In some embodiments of the present disclosure, the semiconductor device package 1 includes the encapsulation layer 30 and the thickness controlling component 40 covering the die 20. The encapsulation layer 30 and the thickness controlling component 40 both protect the die 20 from being damaged by external force, particles or moisture. The encapsulation layer 30 may be opaque, and configured to block unnecessary light from being sensed by the die 20 in some optical applications. The thickness controlling component 40 may include a transparent layer, and configured as a transparent encapsulation layer to fulfill optical criteria in some applications. The thickness of the thickness controlling component 40 can be precisely controlled to be thin, and thus the thickness of the semiconductor device package 1 can be reduced. Accordingly, the semiconductor device package 1 is equipped with both a transparent encapsulation layer and an opaque encapsulation layer, and the overall thickness can still be reduced.

The semiconductor device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

FIG. 1A is a schematic cross-sectional view of a semiconductor device package 1A in accordance with some embodiments of the present disclosure. As shown in FIG. 1A, the shape of the carrier 10 of the semiconductor device package 1A is different from the semiconductor device package 1 in FIG. 1. For example, the bottom surface 10B of the lead frame may include a substantially flat surface. Fingers 10F of the lead frame may extend upward along the vertical projection direction Z.

FIG. 1B is a schematic cross-sectional view of a semiconductor device package 1B in accordance with some embodiments of the present disclosure. As shown in FIG. 1B, the die 20 is at least partially disposed in the recess 1 OR of the lead frame, and thus the overall thickness of the semiconductor device package 1B can be further reduced. In some embodiments, the second surface 20B of the die 20 is exposed from the encapsulation layer 30 to improve heat dissipation.

Figure 2:
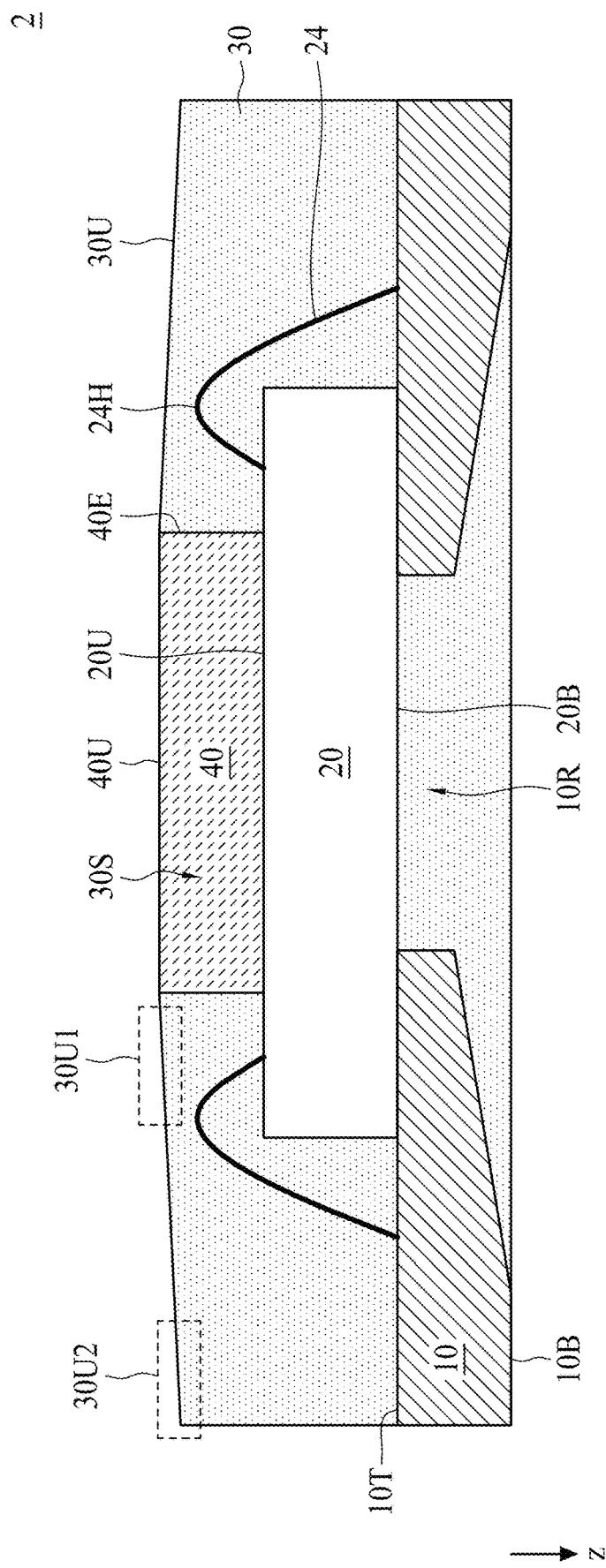
FIG. 2 is a schematic cross-sectional view of a semiconductor device package in accordance with some embodiments of the present disclosure.

FIG. 2 is a schematic cross-sectional view of a semiconductor device package 2 in accordance with some embodiments of the present disclosure. As shown in FIG. 2, in contrast to the semiconductor device package 1, the first upper surface 30U of the encapsulation layer 30 may include a first portion 30U1 adjacent to the second upper surface 40U, and a second portion 30U2 away from the second upper surface 40U. The first portion 30U1 may be substantially coplanar with the second upper surface 40U, and the second portion 30U2 may be lower than the second upper surface 40U. In some embodiments, the first portion 30U1 and the second portion 30U2 each may be a substantially flat surface.

Figure 3:
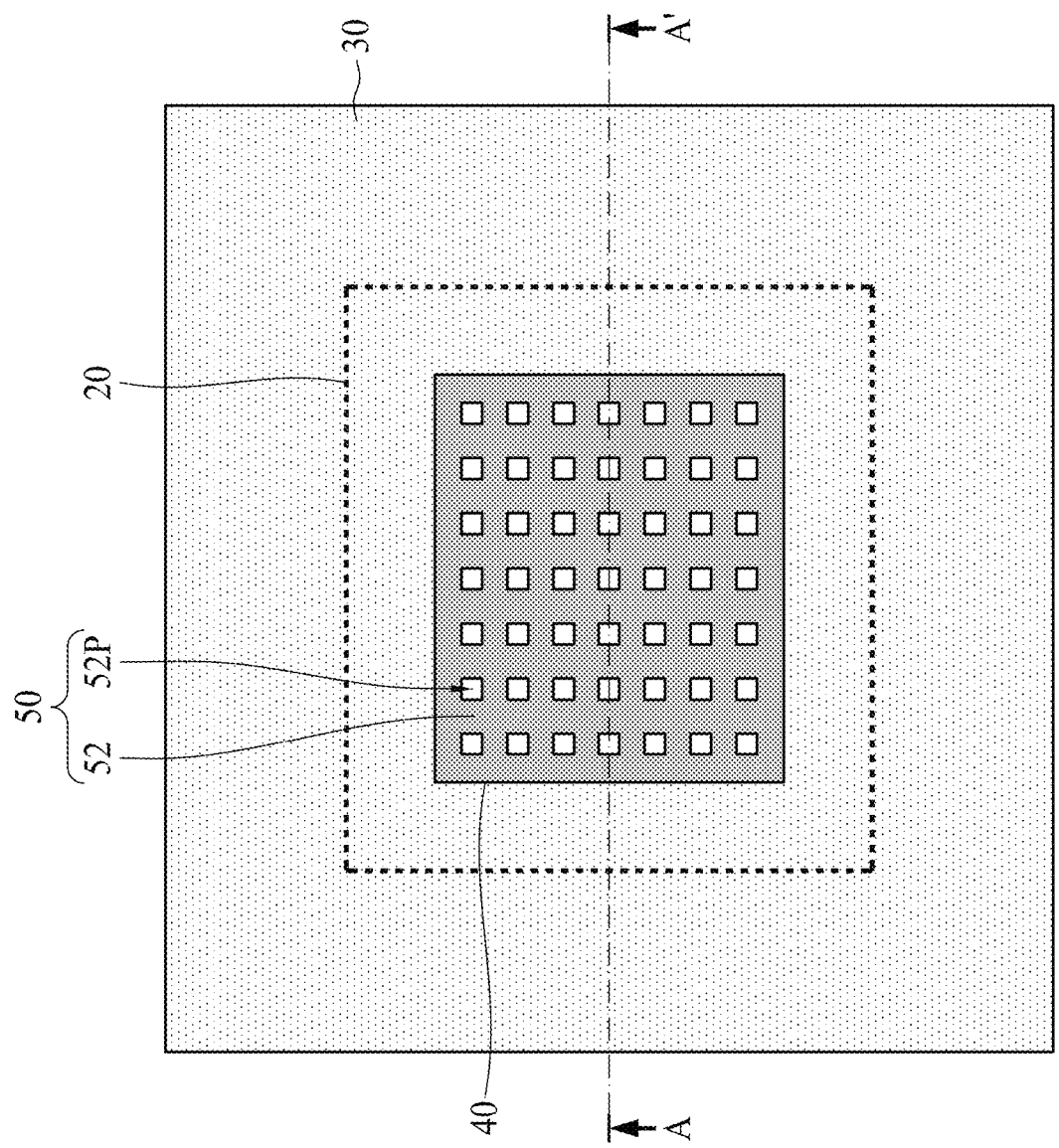
FIG. 3 is a schematic top view of a semiconductor device package in accordance with some embodiments of the present disclosure.
Figure 3A:
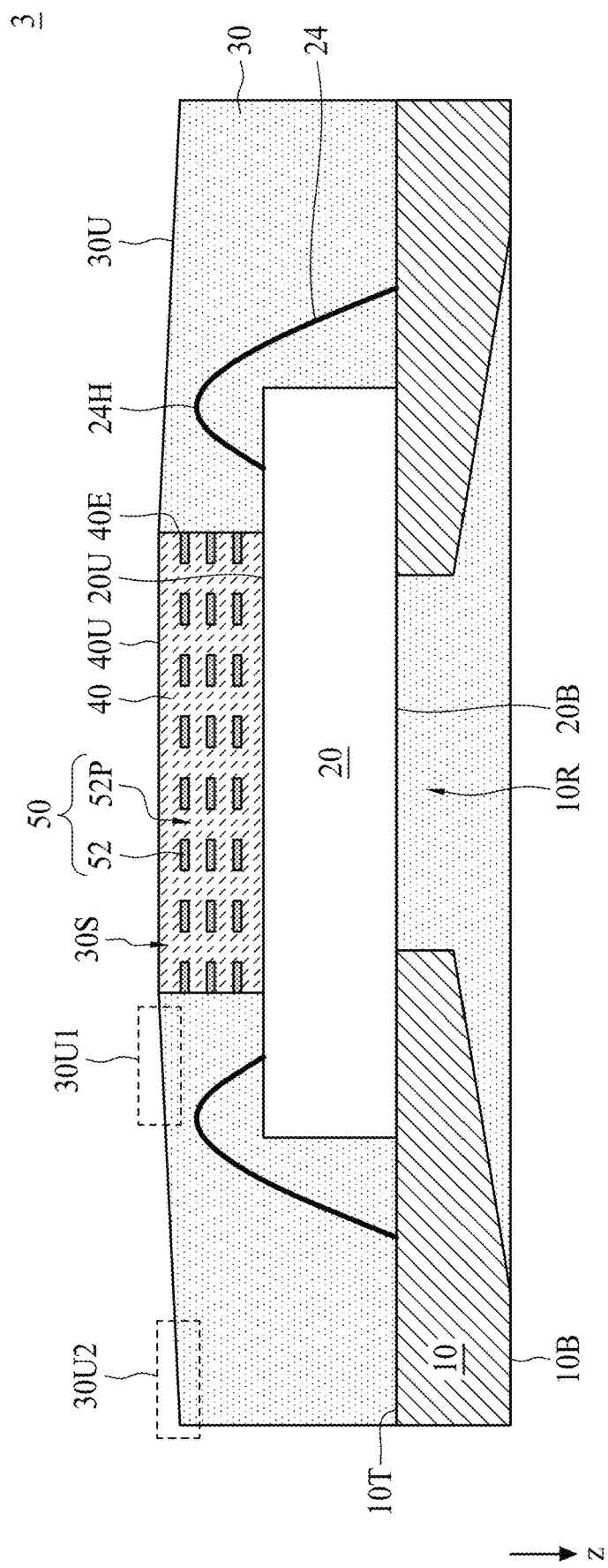
FIG. 3A is a schematic cross-sectional view of a semiconductor device package along line A-A' in FIG. 3.

FIG. 3 is a schematic top view of a semiconductor device package 3 in accordance with some embodiments of the present disclosure, and FIG. 3A is a schematic cross-sectional view of a semiconductor device package 3 along line A-A' in FIG. 3. As shown in FIG. 3 and FIG. 3A, in contrast to the semiconductor device package 2, the semiconductor device package 3 may further include a collimator 50 incorporated with the thickness controlling component 40. In some embodiments, the collimator 50 includes at least one patterned light-shielding layer 52 embedded in the thickness controlling component 40. For example, the patterned light-shielding layer 52 defines a plurality of light-permeable regions 52P such as holes, and the thickness controlling component 40 may be filled in the light-permeable regions 52P. In some embodiments, the material of the light-shielding layer 52 may include an opaque optically-cured material such as black photoresist, and the light-shielding layer 52 may be formed by optical curing operation such as photolithography operation. In some embodiments, the collimator 50 includes a plurality of patterned light-shielding layers 52, and the number of the patterned light-shielding layers 52 can be modified based on collimation criteria.

Figure 4:
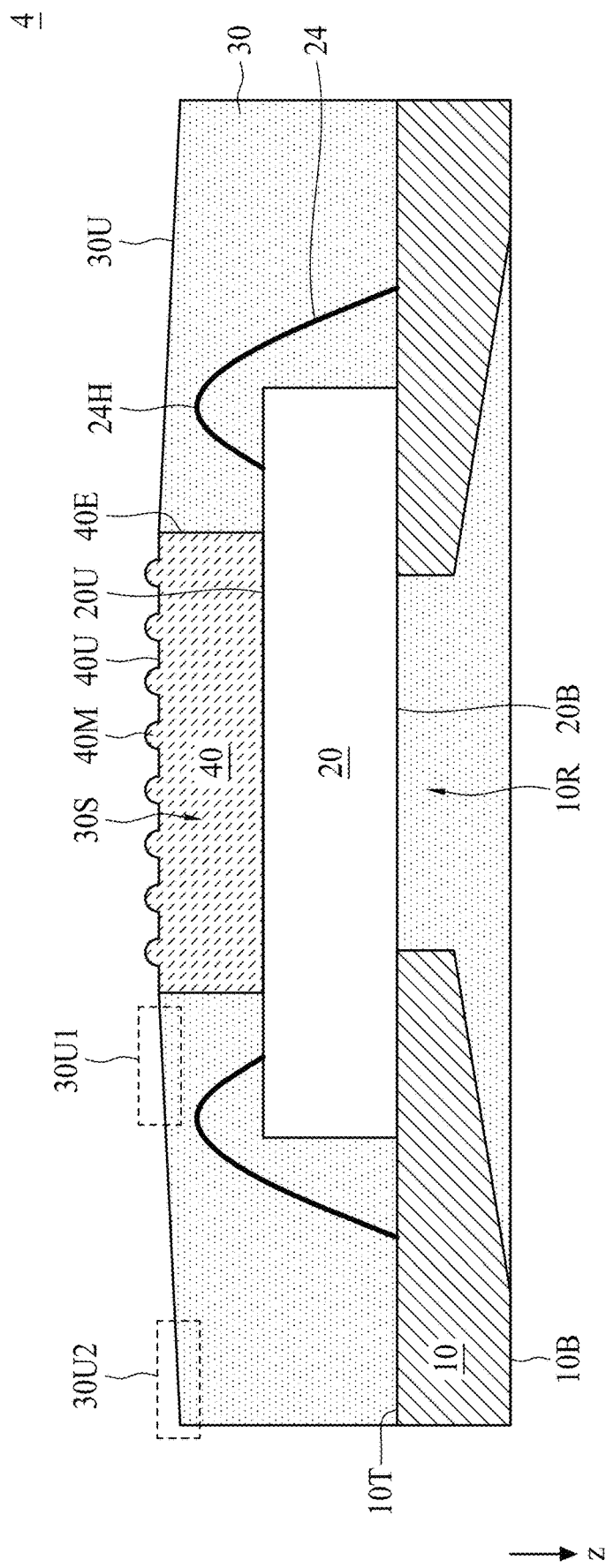
FIG. 4 is a schematic cross-sectional view of a semiconductor device package in accordance with some embodiments of the present disclosure.

FIG. 4 is a schematic cross-sectional view of a semiconductor device package 4 in accordance with some embodiments of the present disclosure. As shown in FIG. 4, in contrast to the semiconductor device package 2, the semiconductor device package 4 may further include one or more micro structures 40M protruding from the second upper surface 40U of the thickness controlling component 40. The micro structures 40M may include one or more micro lenses, micro anti-reflection structures or the like. In some embodiments, the micro structures 40M and the thickness controlling component 40 may be an integrally-formed structure. By way of example, the micro structures 40M and the thickness controlling component 40 may be formed by the same optical curing operation.

Figure 5:
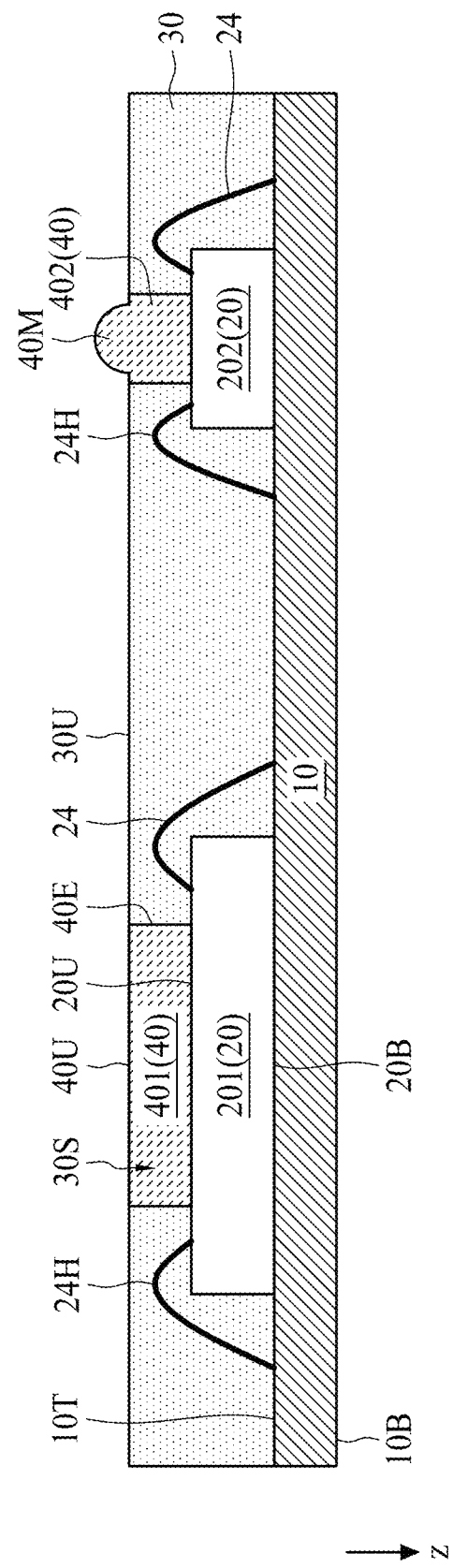
FIG. 5 is a schematic cross-sectional view of a semiconductor device package in accordance with some embodiments of the present disclosure.

FIG. 5 is a schematic cross-sectional view of a semiconductor device package 5 in accordance with some embodiments of the present disclosure. As shown in FIG. 5, the semiconductor device package 5 may include a plurality of dies 20 such as a first die 201 and a second die 202. In some embodiments, the first die 201 may include an optical sensor die, and the second die 202 may include a light emitting die such as a light emitting diode (LED). The first die 201 and the second die 202 may be collectively operated and configured as a proximity sensor. In some embodiments, the semiconductor device package 5 may include a plurality of thickness controlling components 40 such as a first thickness controlling component 401 and a second thickness controlling component 402. The first thickness controlling component 401 may be disposed on the first die 201, and the second thickness controlling component 402 may be disposed on the second die 202. In some embodiments, the first thickness controlling component 401 and the second thickness controlling component 402 may include the same height. In some embodiments, the first thickness controlling component 401 and the second thickness controlling component 402 each may optionally include micro structures 40M such as micro lenses to provide light collection, light reflection, light diffraction or other optical effect. The encapsulation layer 30 may be disposed between the first thickness controlling component 401 and the second thickness controlling component 402 to avoid optical cross-talk.

Figure 6A:
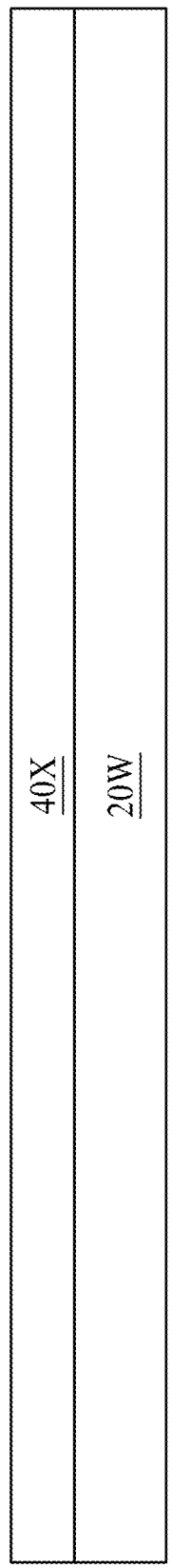
FIG. 6A, FIG. 6B, FIG. 6C, FIG. 6D and FIG. 6E illustrate operations of manufacturing a semiconductor electronic device package in accordance with some embodiments of the present disclosure.
Figure 6B:
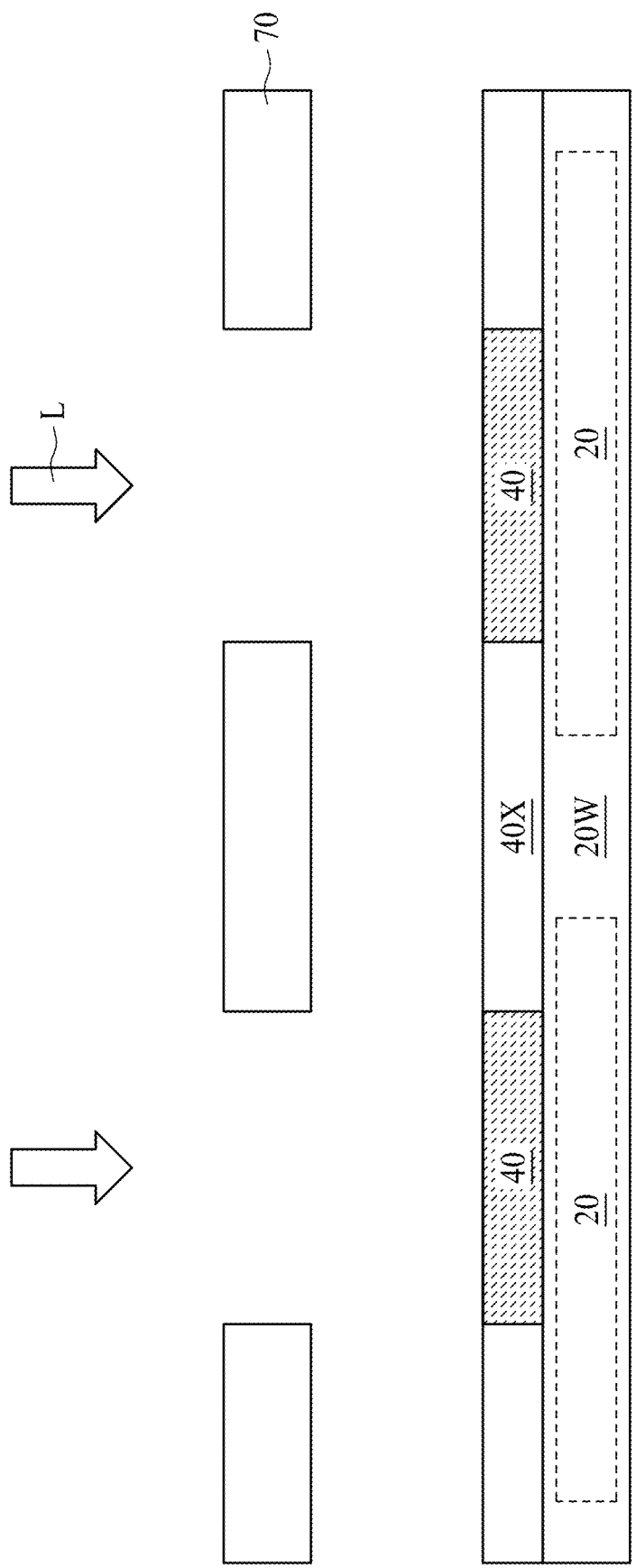

FIG. 6A, FIG. 6B, FIG. 6C, FIG. 6D and FIG. 6E illustrate operations of manufacturing a semiconductor electronic device package in accordance with some embodiments of the present disclosure. As shown in FIG. 6A, at least one die 20 is provided. In some embodiments, a wafer 20 W including a plurality of semiconductor dies 20 is provided. At least one thickness controlling component covering a portion of an upper surface of the at least one die is formed. In some embodiments, the thickness controlling component can be formed by optical curing operation. The thickness tolerance control of the optical curing operation may be less than or equal to ±10% such that the thickness of the thickness controlling component can be precisely controlled and thinned. For example, the thickness controlling component can be formed by coating and photolithography operation including exposure and development processes. By way of example, an optically-sensitive material 40X such as photoresist is coated on the wafer 20 W. In some embodiments, the photoresist may include transparent photoresist. As shown in FIG. 6B, an exposure process is performed using a light L to expose the optically-sensitive material 40X through a photomask 70 to optically cure the optically-sensitive material 40X. The optically-sensitive material 40X is then developed to remove the optically-sensitive material 40X not optically cured to form a plurality of thickness controlling components 40. In some other embodiments, other suitable processes with precise thickness control tolerance such as nanoimprinting operation, two-photon polymerization (2PP) operation or the like can be adopted to form the thickness controlling component.

Figure 6C:
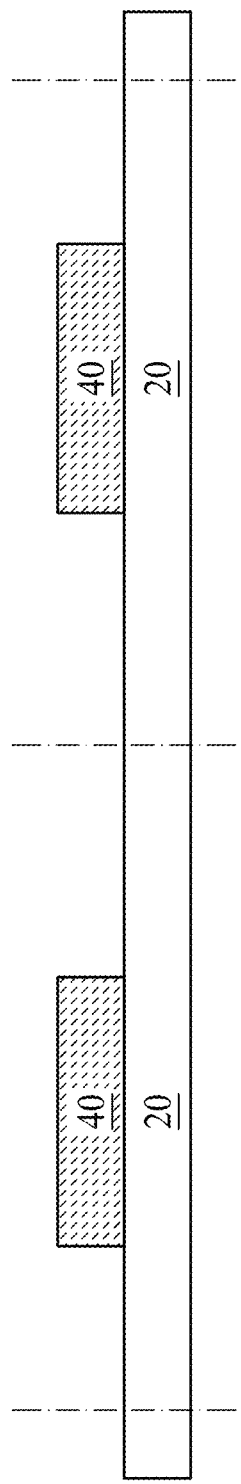
Figure 6D:
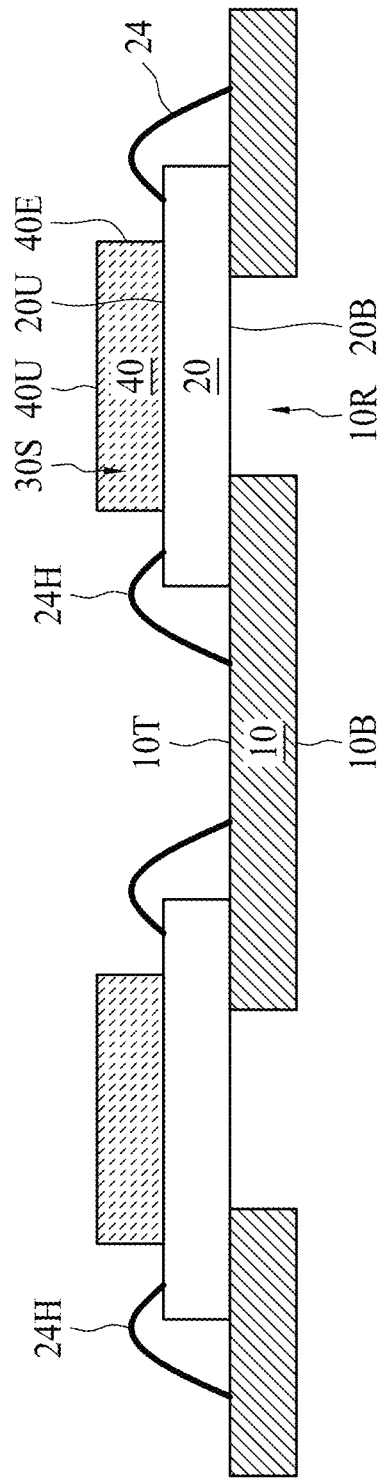

As shown in FIG. 6C, the wafer 20 W is diced to form a plurality of dies 20, and a portion of an upper surface of each die 20 is covered with a thickness controlling component 40 with predetermined thickness. For example, the thickness of the thickness controlling component 40 is in a range of about 100 micrometers to about 150 micrometers. As shown in FIG. 6D, the dies 20 are mounted to a carrier 10. In some embodiments, bonding wires 24 may be formed to electrically connecting the dies 20 to the carrier 10.

Figure 6E:
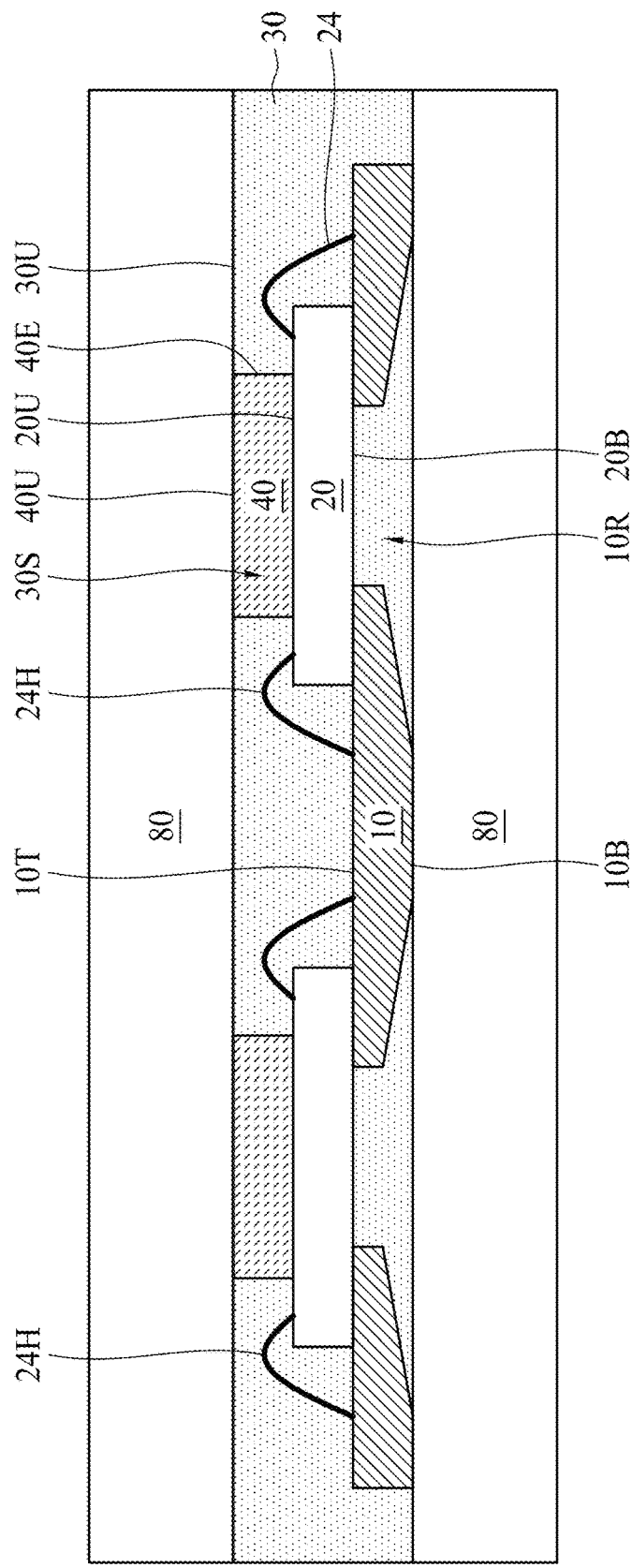

As shown in FIG. 6E, an encapsulation layer 30 such as an opaque encapsulation layer is formed on the carrier 10 to encapsulate another portion of the upper surfaces 20U of the dies 20. In some embodiments, the material of the encapsulation layer 30 may include molding compound, and the encapsulation layer 30 may be formed by molding with a mold 80. By virtue of the thickness controlling component 40, the first upper surface 30U of the encapsulation layer 30 can be controlled at the same horizontal level as the second upper surface 40U of the thickness controlling component 40. The carrier 10 and the encapsulation layer 30 can be diced to form the semiconductor device packages as illustrated in afore-mentioned embodiments.

Figure 7A:
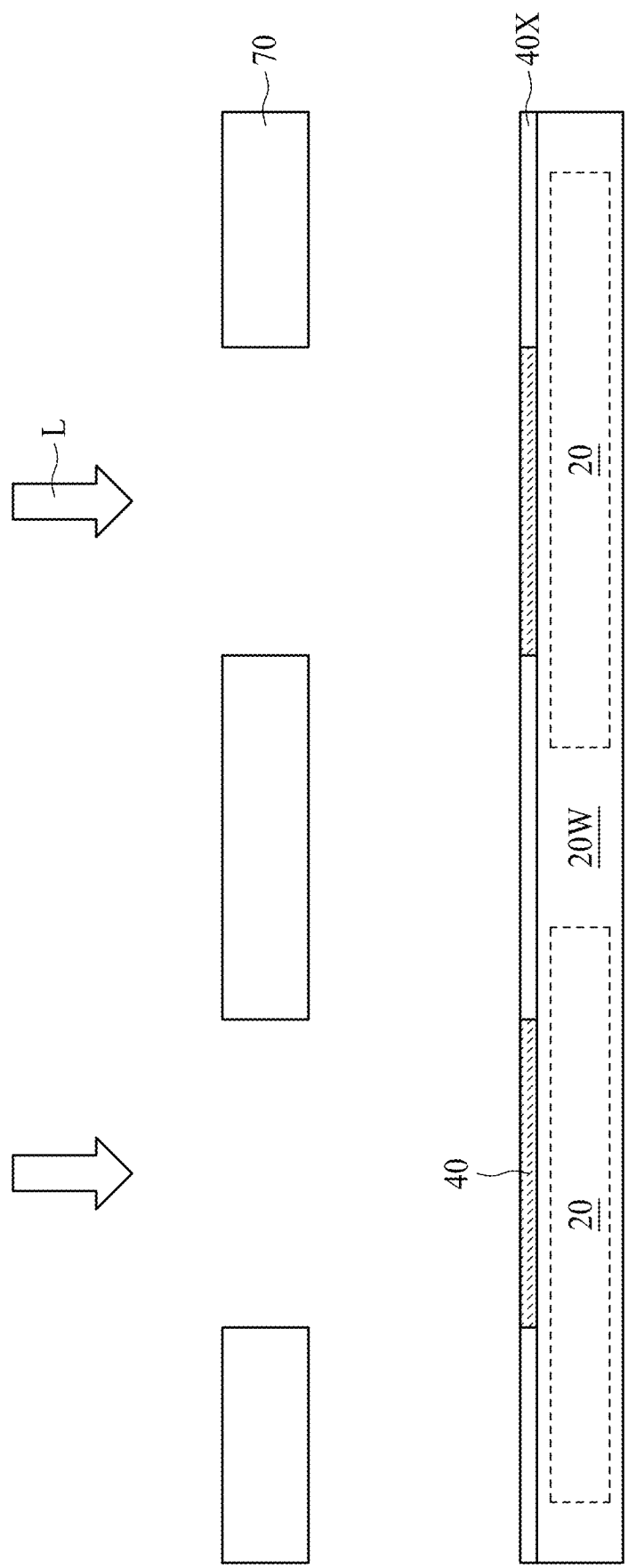
FIG. 7A, FIG. 7B and FIG. 7C illustrate operations of manufacturing a semiconductor electronic device package in accordance with some embodiments of the present disclosure.
Figure 7B:
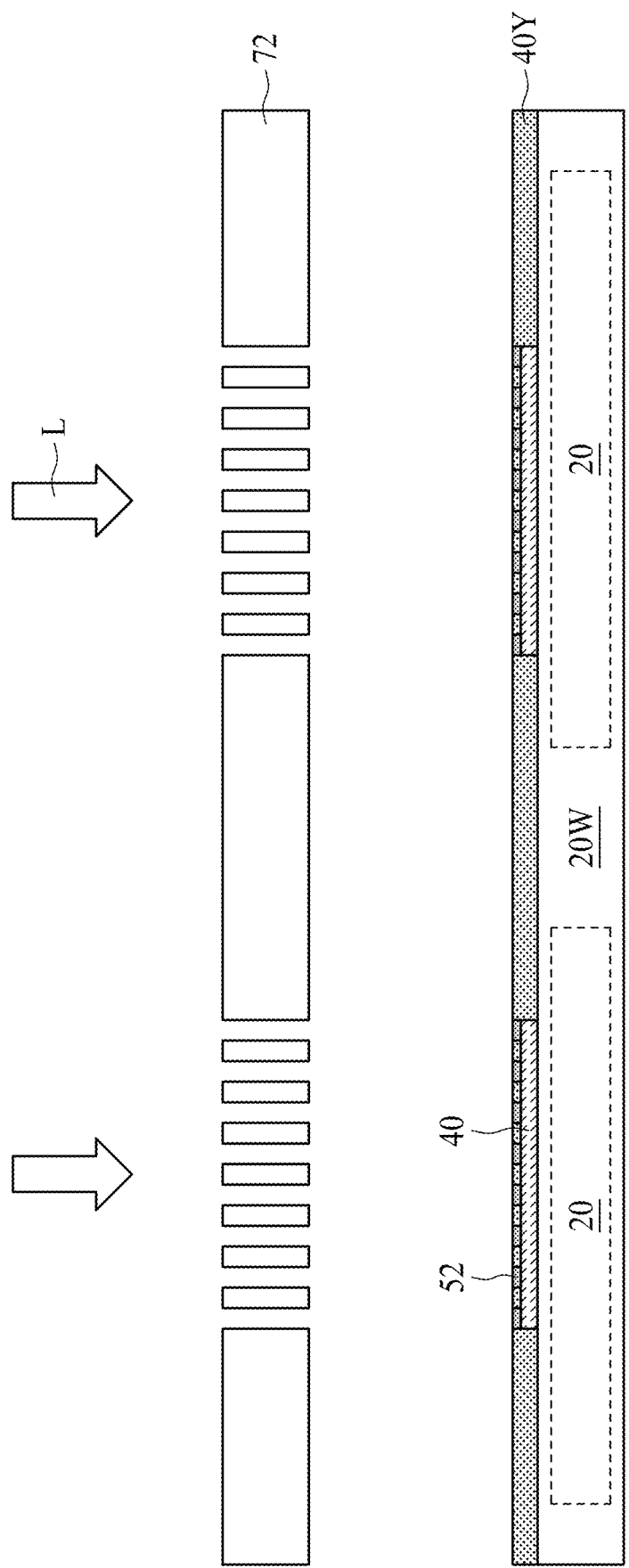
Figure 7C:
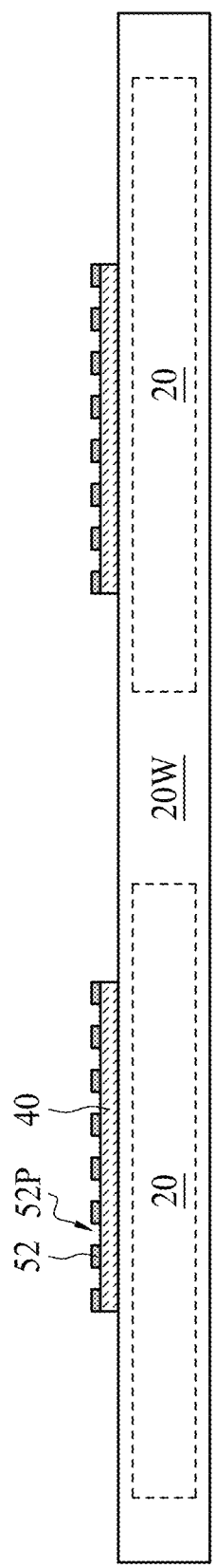

FIG. 7A, FIG. 7B and FIG. 7C illustrate operations of manufacturing a semiconductor electronic device package in accordance with some embodiments of the present disclosure. As shown in FIG. 7A, an optically-sensitive material 40X such as transparent photoresist is coated on the wafer 20 W. An exposure process is performed using a light L to expose the optically-sensitive material 40X through a photomask 70 to optically cure the optically-sensitive material 40X.

As shown in FIG. 7B, the optically-sensitive material 40X is then developed to remove the optically-sensitive material 40X not optically cured. Another optically-sensitive material 40Y such as black photoresist is coated on the wafer 20 W. Another exposure process is performed using a light L to expose the optically-sensitive material 40X through another photomask 72 to optically cure the optically-sensitive material 40Y.

As shown in FIG. 7C, the optically-sensitive material 40Y is then developed to remove the optically-sensitive material 40Y not optically cured to form a patterned light-shielding layer 52 with light-permeable regions 52P. The optically-sensitive material 40X and the optically-sensitive material 40Y can be repeatedly and alternately coated and patterned to form the thickness controlling component 40 with embedded collimator 50 as illustrated in FIG. 3 and FIG. 3A.

In some embodiments of the present disclosure, the semiconductor device package includes the encapsulation layer and the thickness controlling component covering the die. The encapsulation layer and the thickness controlling component both protect the die 20 from being damaged by external force, particles or moisture. The encapsulation layer may be opaque, and configured to block unnecessary light from being sensed by the die in some optical applications. The thickness controlling component may be transparent, and configured as a transparent encapsulation layer to fulfill optical criteria in some applications. The thickness controlling component can be formed by optical curing operation such as photolithography operation, and thus the thickness of the thickness controlling component can be precisely controlled to be thin to reduce the overall thickness of the semiconductor device package. Micro structures such as micro lenses and/or a collimator can be integrally formed with the thickness controlling component.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a carrier;
   a die disposed on the carrier, wherein the die includes a first surface;
   an encapsulation layer disposed on the carrier, and encapsulating a portion of the first surface of the die, wherein the encapsulation layer defines a space exposing another portion of the first surface of the die; and
   a thickness controlling component disposed in the space, wherein the thickness controlling component is configured to define a thickness of the encapsulation layer.

2. The semiconductor device package of claim 1, wherein the encapsulation layer comprises an opaque encapsulation layer.

3. The semiconductor device package of claim 1, wherein the thickness controlling component is transparent.

4. The semiconductor device package of claim 1, wherein a thickness of the thickness controlling component is in a range of about 100 micrometers to about 150 micrometers.

5. The semiconductor device package of claim 1, wherein the die comprises an optical die.

6. The semiconductor device package of claim 5, wherein the optical die comprises an optical sensor die, a light emitting die or a combination thereof.

7. The semiconductor device package of claim 1, wherein the encapsulation layer includes a first upper surface, the thickness controlling component includes a second upper surface, and the first upper surface and the second upper surface are substantially coplanar.

8. The semiconductor device package of claim 7, wherein the first upper surface of the encapsulation layer includes a first portion adjacent to the second upper surface, and a second portion away from the second upper surface, the first portion is substantially coplanar with the second upper surface, and the second portion is lower than the second upper surface.

9. The semiconductor device package of claim 7, wherein an edge of the thickness controlling component is substantially perpendicular to the second upper surface of the thickness controlling component.

10. The semiconductor device package of claim 1, wherein the thickness controlling component and the encapsulation layer do not overlap in a vertical direction of the first surface of the die.

11. The semiconductor device package of claim 1, wherein a material of the thickness controlling component comprises a transparent optically-cured material.

12. The semiconductor device package of claim 1, further comprising a collimator incorporated with the thickness controlling component.

13. The semiconductor device package of claim 1, wherein the carrier comprises a lead frame comprising a top surface, a bottom surface opposite to the top surface, and the lead frame defines a recess.

14. The semiconductor device package of claim 1, further comprising a plurality of bonding wires electrically connecting the die to the carrier, wherein the bonding wires are encapsulated by the encapsulation layer.

15. The semiconductor device package of claim 14, wherein a highest point of each of the bonding wires is lower than an upper surface of the thickness controlling component.

16. An optical device package, comprising:
    a carrier;
    an optical die disposed on the carrier, wherein the die includes a first surface;
    an opaque encapsulation layer disposed on the carrier, and encapsulating the optical die, wherein the opaque encapsulation layer includes a first upper surface and defines a space exposing a portion of the first surface of the optical die; and
    a transparent layer filled in the space, wherein, the first upper surface of the opaque encapsulation layer is substantially planar.

17. The optical device package of claim 16, wherein a thickness of the transparent layer is in a range of about 100 micrometers to about 150 micrometers.

18. The optical device package of claim 16, wherein a material of the transparent layer comprises a transparent optically-cured material.

19. The optical device package of claim 16, further comprising a collimator incorporated with the transparent layer.

20. The optical device package of claim 16, wherein the transparent layer comprises a second upper surface, and the first upper surface of the opaque encapsulation layer is substantially coplanar with the second upper surface of the transparent layer.

21. A method of manufacturing a semiconductor device package, comprising:
    providing at least one die;
    forming a thickness controlling component covering a portion of an upper surface of the at least one die; and
    forming an encapsulation layer to cover another portion of the upper surface of the at least one die after forming the thickness controlling component.

22. The method of claim 21, wherein a material of the thickness controlling component comprises an optically-sensitive material, and the method further comprises before forming the encapsulation layer, performing an optical curing operation on the optically-sensitive material to pattern the optically-sensitive material to form the thickness controlling component.

* * * * *